(12) United States Patent
Muza

(10) Patent No.: US 6,396,352 B1
(45) Date of Patent: May 28, 2002

(54) CMOS POWER AMPLIFIER FOR DRIVING LOW IMPEDANCE LOADS

(75) Inventor: John M. Muza, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/638,104

(22) Filed: Aug. 11, 2000

Related U.S. Application Data

(60) Provisional application No. 60/151,141, filed on Aug. 27, 1999.

(51) Int. Cl.[7] .................................................. H03F 3/04
(52) U.S. Cl. ........................ 330/311; 330/277; 330/295
(58) Field of Search ................................. 330/277, 295, 330/311

Primary Examiner—Michael B Shingleton
(74) Attorney, Agent, or Firm—Alan K. Stewart; Wade James Brady, III; Frederick J. Telecky, Jr.

(57) ABSTRACT

The two-stage power amplifier includes: a first stage transconductor 60; and a second stage having at least two parallel output branches 57–59 supplying current to an output node 89, each output branch has an input coupled to an output of the first stage transconductor 60.

5 Claims, 2 Drawing Sheets

CMOS POWER AMPLIFIER FOR DRIVING LOW IMPEDANCE LOADS

This application claims priority under 35 U.S.C. §119 (e)(1) of provisional application No. 60/151,141, filed Aug. 27, 1999.

FIELD OF THE INVENTION

This invention generally relates to electronic systems and in particular it relates to analog amplifier circuits.

BACKGROUND OF THE INVENTION

A typical prior art 2-stage amplifier block diagram is shown in FIG. 1. The circuit of FIG. 1 includes transconductors 20 and 22, resistors 24–26, capacitors 28–30, output resistance 32, output capacitance 34, input voltage $V_{in}$, and output voltage $V_{out}$. The prior art circuit of FIG. 2 shows the last section of a prior art folded cascode input stage coupled to an output stage as used in transconductors 20 and 22. The circuit of FIG. 2 includes output transistors 40 and 42, capacitors 44 and 46, quiescent current bias network 48, output voltage $V_{out}$, and transistors 50–53. To get maximum current drive, transistors 40 and 42 need to be very large devices. In order to not waste quiescent current, the gate-to-source voltage minus the threshold voltage ($V_{GS}-V_T$) of transistors 40 and 42 are set as small as possible. The maximum output current determines the size of transistors 40 and 42. The quiescent current is set by the second stage transconductance and the total harmonic distortion (THD) level of performance at small signal levels. At very low $V_{GS}-V_T$ the quiescent current is less controlled as transistors 40 and 42 head for subthreshold region of operation. Another problem with very low $V_{GS}-V_T$ is that the input stage cascodes may not have the head room required for maximum gain out of the stage. This is certainly true for modern CMOS processes where the $V_T$ of the devices are going down, and operating voltages for systems is going down as well. Another problem is the very large parasitic capacitance of the large output transistors 40 and 42. Typical load resistances for designs using CMOS power amplifiers are 32 Ohm all the way down to 8 ohm. With signal swings in the 4 volt range, this translates to current in the 70 mA to 250 mA range without sacrificing performance. These large power levels even with 90 Angstrom gate oxide on analog processes can result in PMOS devices sizes approaching 20,000 um (W/L). In these cases the parasitic capacitance of the output transistors 40 and 42 would be enormous, and would cause major problems with the stability of the amplifier. Using these prior art techniques, the quiescent current needed for proper operation of an amplifier of this type is very high. An amplifier of this type achieves good overall performance only at a maximum current to quiescent current ratio of 60–70. For proper operation the quiescent current level has to be such that the maximum load current is about 60–70 times the quiescent current. This does not solve the stability issue of the parasitic capacitance being very large.

SUMMARY OF THE INVENTION

A two-stage power amplifier includes: a first stage transconductor; and second stage having at least two parallel output branches supplying current to an output node, each output branch has an input coupled to an output of the first stage amplifier.

DETAILED DESCRIPTION OF PREFERRED EMBODIMENTS

Figure 3:
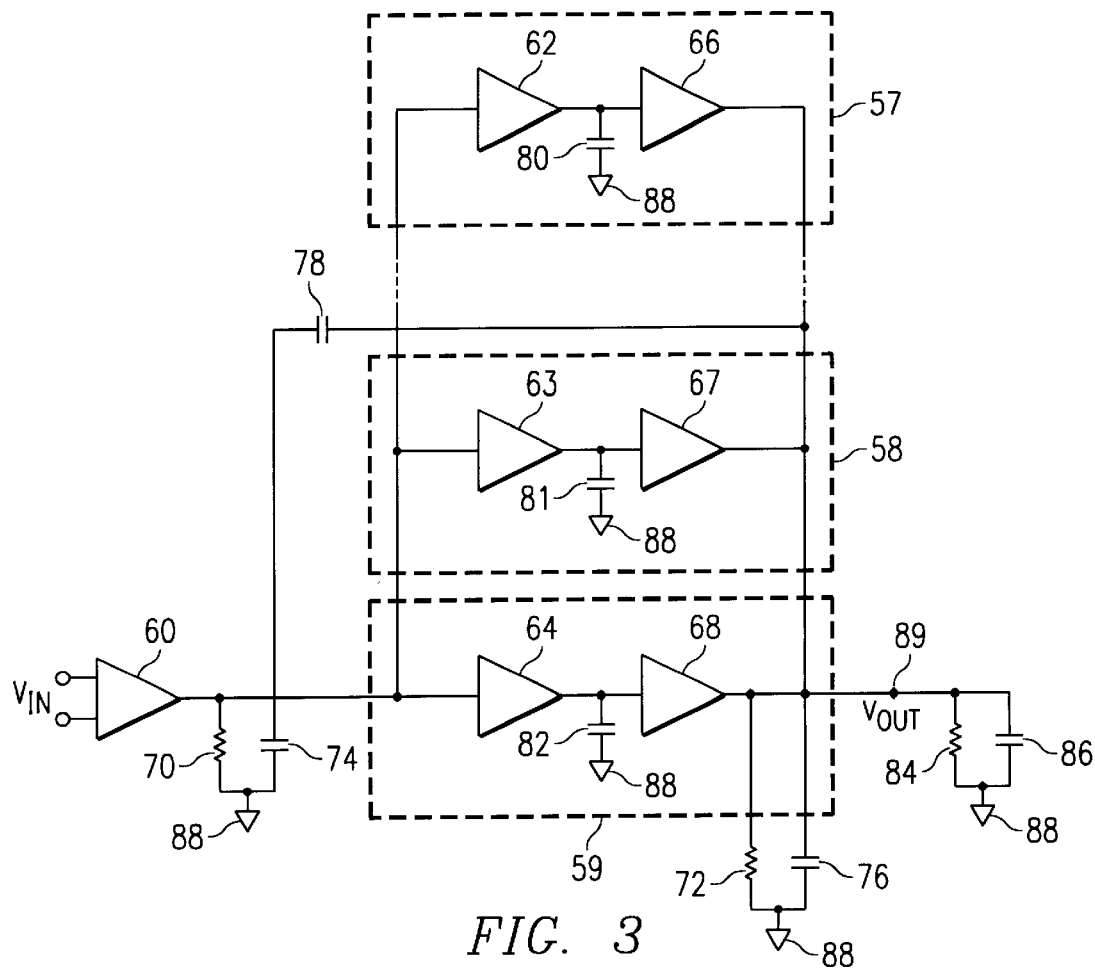
FIG. 3 is diagram of a preferred embodiment two stage power amplifier with multiple output branches.

The preferred embodiment circuit of FIG. 3 is a two-stage power amplifier with multiple output branches. The circuit of FIG. 3 includes first stage transconductor 60, unity gain amplifiers 62–64, second stage transconductors 66–68, resistors 70 and 72, capacitors 74 and 76, Miller capacitor 78, capacitors 80–82, load resistance 84, load capacitance 86, common node 88, output node 89, input voltage $V_{IN}$ and output voltage $V_{out}$. The circuit of FIG. 3 is a two-stage design compensated by Miller capacitor 78. The transconductance of the second stage of the circuit of FIG. 3 is the sum of the transconductance of all the branches. The unity gain amplifiers 62–64 level shift the bias point for each branch. The circuit of FIG. 3 is shown with three second stage branches 57–59, but any number of branches could be used.

Figure 1:
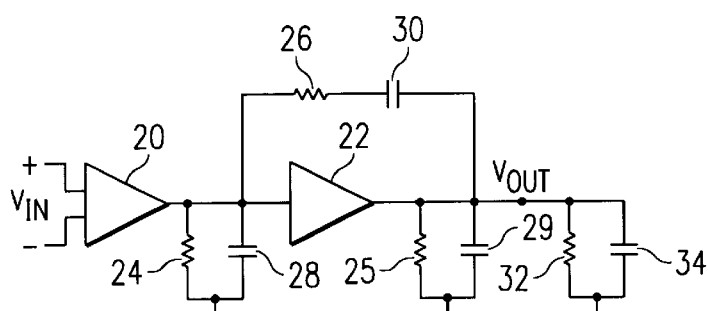
FIG. 1 is a typical prior art two-stage amplifier block diagram.
Figure 2:
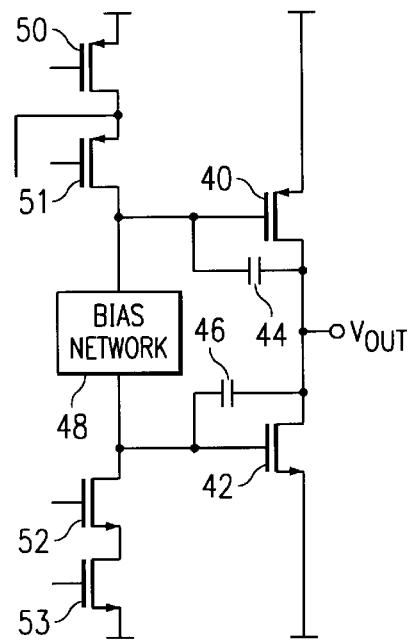
FIG. 2 is a schematic circuit diagram of the last section of a prior art folded cascode input stage coupled to an output stage.
Figure 4:
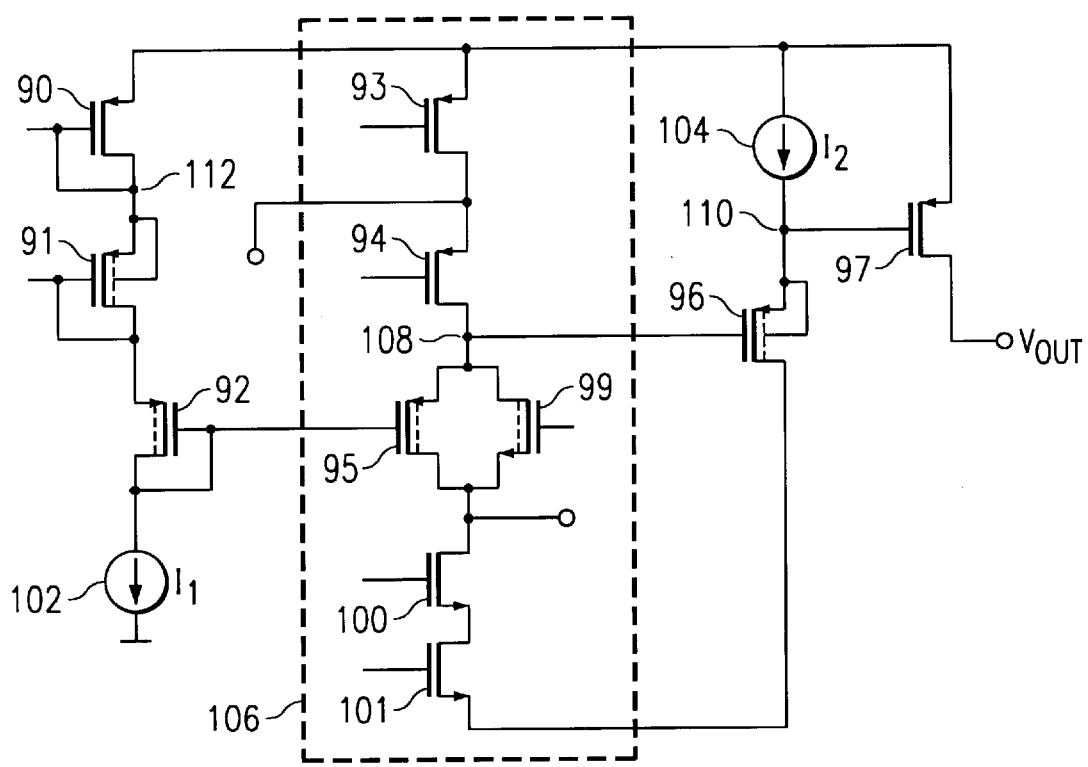
FIG. 4 is a partial detailed circuit diagram of the preferred embodiment of FIG. 3 with a single output branch.

FIG. 4 is a partial detailed circuit diagram of the preferred embodiment of FIG. 3. The circuit of FIG. 4 includes NMOS transistors 90–97, PMOS transistors 99–101, current sources 102 and 104, and output voltage $V_{out}$. Circuit 106 is the output section of the folded cascode input stage 60, shown in FIG. 3. The biasing technique (class AB) that includes transistors 90, 92, 95, and 97 is modified from the prior art designs by the addition of transistors 91 and 96. This moves node 108 lower in voltage so that the cascode can have more headroom which was one of the problems of the prior art device of FIG. 2. The voltage at node 110 still remains equal to the voltage at node 112, so that current $I_I$ multiplied by the width-to-length (W/L) ratio of transistor 97 to transistor 90 flows through transistor 97. The circuit of FIG. 4 also isolates the input stage from the very large parasitic capacitance of transistor 97 with the source-follower formed by transistor 96. The large parasitic capacitance is then easier to drive. Transistor 96 performs as the DC level shifter for the biasing and as an AC type source-follower.

Figure 5:
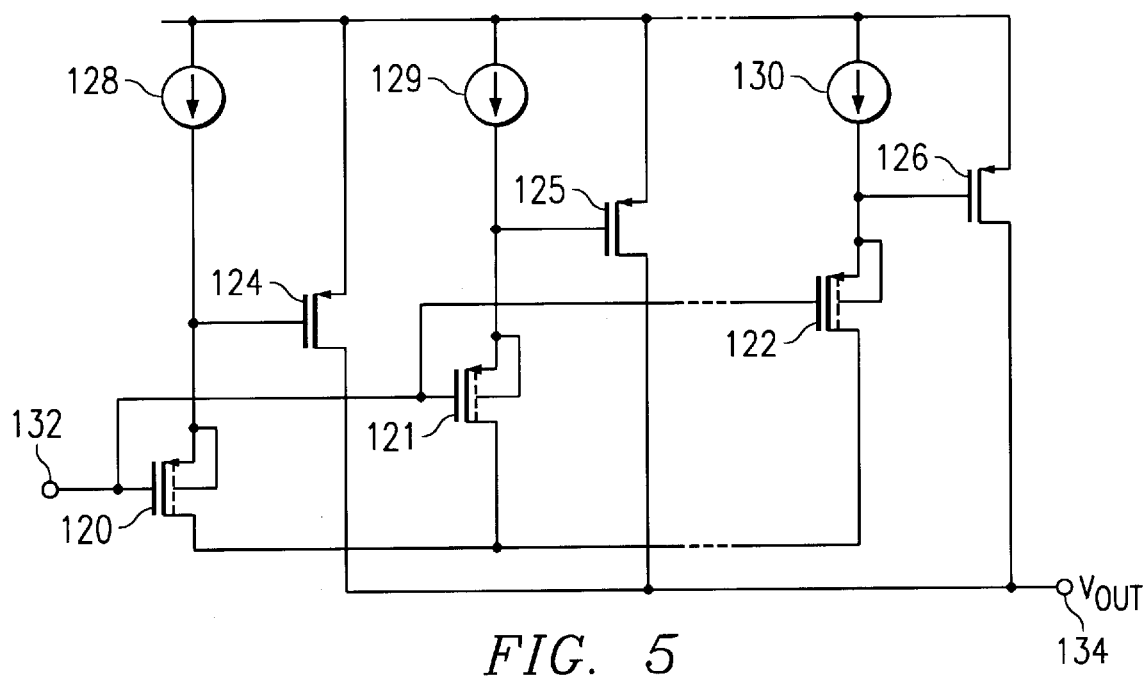
FIG. 5 is a partial detailed circuit diagram of multiple source follower output stages.

To achieve the desired current ratio of the output current to the quiescent current, the circuit of FIG. 4 is extended as shown by the circuit of FIG. 5. The circuit of FIG. 5 includes source follower transistors 120–122, output transistors 124–126, current sources 128–130, input node 132, output node 134, and output voltage $V_{out}$. By taking multiple source-follower output device branches biased at different points, multiple large drivers are put in parallel, but not all of them are conducting large currents at quiescent. They can be throttled back to have a small current when desired.

In the circuit of FIG. 5, transistor 124 is the same as transistor 97 in FIG. 4. Transistors 121 and 122 are sized smaller than transistor 120, but conduct the same current. Because the ($V_{GS}-V_T$) of transistors 121 and 122 is greater than for transistor 120, the bias point for the output transistors 125 and 126 will be higher. Transistors 125 and 126 are as large as or larger than transistor 124, which allows transistors 125 and 126 to be pushed into subthreshold operation. In this state, they conduct very small currents which improves the quiescent current value. This gives the amplifier much more current drive for maximum signal peaks. A much higher total output current capacity is provided. Because all of the branches are biased from a dependent node 132, the biasing scheme still holds. If multiple branches are added with independent sections, it looks like two or more different gain paths to the output node and the feedback around the amp will not allow this in closed-loop operation.

One advantage of the preferred embodiment is that it solves the problem of huge parasitics caused by large power devices. The source follower stages distribute the massive output device into many branches in parallel. This reduces the parasitic capacitance to a more reasonable size. Another advantage is that all the additional output branches that are in subthreshold burn little current, but their transconductance is not small. These branches do contribute much more total transconductance to the second stage (the transconductances sum to the output node), therefore the DC gain into such a small load resistance is much improved. Also, the compensation capacitor $C_c$ can be smaller.

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. A two-stage power amplifier comprising:

a first stage transconductor;

second stage having at least two parallel output branches supplying current to an output node, each output branch has an input coupled to an output of the first stage transconductor, wherein each of the output branches comprises:

a unity gain amplifier for providing a voltage level shift; and a second stage transconductor having an input coupled to an output of the unity gain amplifier.

2. The amplifier of claim 1 wherein the unity gain amplifier is a source follower output stage.

3. The amplifier of claim 1 wherein the unity gain amplifier comprises a first transistor having a gate coupled to an output of the first stage transconductor; and the second stage transconductor comprises a second transistor having a gate coupled to a source of the first transistor and a drain coupled to the output node.

4. The amplifier of claim 3 further comprising a current source coupled to the source of the first transistor.

5. The amplifier of claim 1 further comprising a capacitor coupled between the output of the first stage transconductor and the output node.

* * * * *